US 6,677,254 B2

(12) United States Patent
Narwankar et al.

(10) Patent No.: US 6,677,254 B2
(45) Date of Patent: Jan. 13, 2004

(54) PROCESSES FOR MAKING A BARRIER BETWEEN A DIELECTRIC AND A CONDUCTOR AND PRODUCTS PRODUCED THEREFROM

(75) Inventors: Pravin Narwankar, Sunnyvale, CA (US); Mouloud Bakli, Crollis (FR); Ravi Rajagopalan, Sunnyvale, CA (US); Randall S. Urdahl, Mountain View, CA (US); Asher Sinensky, Berkeley, CA (US); Shankarram Athreya, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 09/911,947

(22) Filed: Jul. 23, 2001

(65) Prior Publication Data

US 2003/0025146 A1 Feb. 6, 2003

(51) Int. Cl.$^7$ .............................................. H01L 21/31
(52) U.S. Cl. ..................... 438/785; 438/240; 438/769; 438/770; 438/775; 438/786
(58) Field of Search ................................ 438/240, 785, 438/786, 769, 770, 775

(56) References Cited

U.S. PATENT DOCUMENTS

| 5,317,187 | A | * | 5/1994 | Hindman et al. ............ 257/659 |
| 5,599,739 | A | | 2/1997 | Merchant et al. |
| 5,616,518 | A | | 4/1997 | Foo et al. |
| 5,693,561 | A | | 12/1997 | Merchant et al. |
| 5,780,115 | A | * | 7/1998 | Park et al. ................... 427/539 |
| 5,893,752 | A | * | 4/1999 | Zhang et al. ................ 438/627 |
| 5,936,831 | A | | 8/1999 | Kola et al. |
| 5,948,216 | A | | 9/1999 | Cava et al. |
| 5,977,582 | A | | 11/1999 | Fleming et al. |
| 6,001,741 | A | | 12/1999 | Alers |
| 6,075,691 | A | | 6/2000 | Duenas et al. |
| 6,103,567 | A | * | 8/2000 | Shih et al. ................... 438/239 |
| 6,103,586 | A | | 8/2000 | Chetlur et al. |
| 6,117,739 | A | | 9/2000 | Gardner et al. |
| 6,204,203 | B1 | | 3/2001 | Narwankar et al. |
| 6,281,142 | B1 | * | 8/2001 | Basceri et al. .............. 257/103 |
| 6,284,663 | B1 | * | 9/2001 | Alers ........................... 438/706 |
| 6,365,486 | B1 | * | 4/2002 | Agarwal et al. ............ 438/240 |
| 2001/0011740 | A1 | * | 8/2001 | Deboer et al. .............. 257/306 |
| 2002/0022334 | A1 | * | 2/2002 | Yang et al. .................. 438/396 |
| 2002/0030222 | A1 | * | 3/2002 | Agarwal ...................... 257/310 |
| 2002/0036313 | A1 | * | 3/2002 | Yang et al. .................. 257/306 |
| 2003/0025146 | A1 | * | 2/2003 | Narwankar et al. ......... 257/310 |

OTHER PUBLICATIONS

Kamiyama, S., et al., entitled "Ultra–Thin TiN/Ta$_2$O$_5$/W Capacitor Technology for 1Gbit DRAM," 1993 IEEE, 93–49–52.
Baliga, J., "New Materials Enhance Memory Performance," Semiconductor International—Nov. 1999.

* cited by examiner

Primary Examiner—Amir Zarabian
Assistant Examiner—Jeff Vockrodt
(74) Attorney, Agent, or Firm—Law Office of Alan W. Cannon

(57) ABSTRACT

The formation of a barrier layer over a high k dielectric layer and deposition of a conducting layer over the barrier layer prevents intermigration between the species of the high k dielectric layer and the conducting layer and prevents oxygen scavenging of the high k dielectric layer. One example of a capacitor stack device provided includes a high k dielectric layer of Ta$_2$O$_5$, a barrier layer of TaON or TiON formed at least in part by a remote plasma process, and a top electrode of TiN. The processes may be conducted at about 300 to 700° C. and are thus useful for low thermal budget applications. Also provided are MIM capacitor constructions and methods in which an insulator layer is formed by remote plasma oxidation of a bottom electrode.

24 Claims, 7 Drawing Sheets

Behavior for Annealed TaN Films with different N: Ta ratios

Behavior for Annealed TaN Films with different N: Ta ratios

PROCESSES FOR MAKING A BARRIER BETWEEN A DIELECTRIC AND A CONDUCTOR AND PRODUCTS PRODUCED THEREFROM

FIELD OF THE INVENTION

The present invention relates generally to methods for improving the interface between a dielectric and a conductor in semiconductor devices.

BACKGROUND OF THE INVENTION

The reliable operation of integrated circuits is critically dependent on the reliability of the increasingly thin dielectric layers used in circuit devices. As transistors have become smaller and more densely packed, the dielectrics have become thinner. Capacitor and gate dielectrics are often less than 80 angstroms in thickness, sometimes approaching 50 angstroms or less. For integrated circuits to work, these thin layers in each of thousands of different transistors must provide sufficient capacitance to drive the device, protect the channel from migration of impurities and avoid production of charge traps at their interfaces. These demanding requirements may soon exceed the capacities of conventional silicon oxide layers. Silicon oxide layers less than 2 nm may have prohibitively large leakage currents.

Efforts to replace silicon oxide as the gate dielectric have thus far proved less than satisfactory. Because of its relatively low dielectric constant (approx. 3.9), the largest capacitance obtainable with a thin layer of silicon oxide is about 25 fF/$\mu$m$^2$. This limits the scaling of transistors to smaller sizes because the capacitance will not be sufficient to drive the device. Higher dielectric constant tantalum oxide has been tried, but results are poor due to a high density of charge traps at the dielectric/silicon interface. Composite layers of $SiO_2/Ta_2O_5$ and $SiO_2/Ta_2O_5/SiO_2$ were tried, but the necessary resulting thicknesses limit the capacitance which can be obtained. Efforts have also been made to prevent charge traps by depositing a thin layer of silicon nitride between the silicon and the tantalum oxide. But the nitride layer also reduces the capacitance and thus limits scaling of the device. See U.S. Pat. No. 5,468,687 issued to D. Carl et al on Nov. 21, 1995 and Y. Momiyama et al, "Ultra-Thin $Ta_2O_5/SiO_2$Gate Insulator with TiN Gate", 1997 *Symposium on VLSI Technology*, Digest of Technical Papers, pp. 135–136. Furthermore, efforts to make capacitors using $Ta_2O_5$ films deposited by reactive sputtering, chemical vapor deposition (CVD), and plasma enhanced chemical vapor deposition have produced devices having high leakage currents and low breakdown voltages. See T Aoyama et al., "Leakage current mechanism of amorphous and polycrystalline $Ta_2O_5$ films grown by chemical vapor deposition", *J. Electrochem. Soc.*, Vol. 143, No. 3, pp. 977–983 (March 1996).

Furthermore, these $Ta_2O_5$ films degraded upon thermal annealing above 200° C. with irreversible increases in the temperature coefficient of capacitance (TCC) and the dissipation factor. See J. M. Schoen et al, "The correlation between temperature coefficient of capacitance and dielectric loss in tantalum and tantalum-aluminum anodic oxides," J. Electrochem. Soc., Vol. 119, pp. 1215–1217 (September 1972). This degradation is believed to be due to the diffusion of electrode metal atoms into the dielectric and diffusion of oxygen out, creating oxygen deficiency defects.

A variety of electrode metals have been tried to overcome degradation problems, but with less than satisfactory results. Chromium was tried but specifically rejected. See M. Peters et al., "Thermally stable thin film tantalum pentoxide capacitor", *Proc. of the International Conference on Multichip Modules*, Denver, pp. 94–99 (April 1996).

Ruthenium (Ru) has been employed for both the bottom and top electrodes in a capacitive structure, with mixed results. Referring to FIG. 1, a film of $Ta_2O_5$ 104 was deposited over the bottom electrode 102 as the dielectric layer 104 in this stack 100. After annealing of the dielectric layer 104 in an oxygen rich environment, a top electrode 106 was deposited over the dielectric layer 104. The interface between the top electrode 106 and the dielectric 104 can be problematic, as reaction between the dielectric layer and the ruthenium may occur, leading to mixing of phases between the two layers and oxygen scavenging from the dielectric layer which reduces the overall dielectric constant.

Similarly, tungsten (W) and other metals run the same risk of phase mixing with the dielectric layer and oxidation scavenging of the dielectric layer upon deposition over the dielectric layer. When nitrides of metals, such as TiN or TaN are used, and $NH_3$ is used in forming the nitride as it is being deposited, the $NH_3$ in the process can act to reduce the dielectric layer, which also degrades its performance.

As such, there is a need for improved processes for employing high k dielectrics in thin films to make semiconductor devices that will not degrade due to the diffusion of electrode metal atoms into the dielectric and diffusion of oxygen out, creating oxygen deficiency defects. There is also a need to produce these devices at temperatures which will not degrade the dielectric or metals in the devices.

SUMMARY OF THE INVENTION

In view of the foregoing background, the present invention is directed to improved processes for making interfaces between high k dielectrics and conducting layers that will provide superior performance to those known in the art, and products resulting therefrom.

The present invention includes a method of making a barrier on a high k dielectric material by providing a substrate having an upper surface comprising a high k dielectric material; remotely generating a plasma using a nitrogen containing source; and flowing the plasma over the upper surface comprising a high k dielectric material to form an oxynitride layer on the upper surface.

At least the upper surface of the substrate may be annealed in an oxygen rich environment prior to flowing the plasma.

In an example where the high k dielectric material comprises $Ta_2O_5$, the nitrogen containing source may comprise $N_2$ and the oxynitride layer which is formed comprises TaON.

In another example, a remote plasma is generated using $NH_3$ as a nitrogen containing source, and a TaON layer is formed by flowing the plasma over the high k material.

In either of the above examples, a remote plasma may be generated using an oxygen containing source, and the plasma is flowed over the oxynitride layer to saturate any reduced species remaining in the oxynitride layer.

A conducting layer is then deposited over the oxynitride layer, by chemical vapor deposition, for example. In the case of a capacitor stack arrangement, the conducting layer is a top electrode. The conducting layer may comprise TiN, for example.

Generally, the processes according to the present invention are conducted within a temperature range of about 300° to 700° C. and are thus appropriate for low thermal budget applications.

In another example, a layer of TiN is deposited over a high k dielectric material, by chemical vapor deposition, for example. A remote plasma is formed using an oxygen containing source, and the plasma is flowed over the TiN layer to form an oxynitride layer on the upper surface.

At least the upper surface of the high k dielectric material may be annealed prior to depositing the layer of TiN.

The oxygen containing source may be oxygen or $N_2O$, for example.

The high k dielectric material may comprise $Ta_2O_5$, for example, in which case the oxynitride layer comprises TaON.

A conducting layer is next deposited over the oxynitride layer. In the case of a capacitor stack arrangement, the conducting layer is a top electrode. The conducting layer may comprise TiN, for example.

A stack capacitor device comprising a high k dielectric layer, a barrier layer overlying the high k dielectric layer and having been formed, at least in part by a remote plasma process; and a top electrode overlying the barrier layer is disclosed.

The high k dielectric layer may comprise $Ta_2O_5$. The barrier layer may comprise TaON or TiON, for example. The top electrode may comprise TiN.

The present invention provides methods for improving the performance of a stack capacitor. For example, deposition of a barrier layer of either TaON or TiON between a high k dielectric layer and a top electrode in the presence of a low thermal budget can improve the performance of the stack capacitor.

The capacitors of the present invention have substantially the same characteristics when subjected to either a forward bias or a reverse bias. Also, because of the low leakage current density of the capacitors of the present invention (which is indicative of a low defect density), capacitors with larger areas than prior art capacitors are possible. Also, because of the fact that anodic oxidation of the metal occurs at relatively low temperatures, the process of the present invention is useful when forming capacitors on substrates that cannot be subjected to the high temperature annealing process prescribed by the prior art for reducing the leakage current density of dielectric materials.

The formation of a barrier layer according to the present invention, at the interface between a high k dielectric layer and the top electrode significantly improves the dielectric properties of the stack capacitor. For example, it was found that creating a $Ta_2O_5$ monolayer with Remote Plasma Nitridation (RPN) in combination with ammonia, later followed with Remote Plasma Oxidation (RPO) produces a thicker layer of TaON because oxygen vacancies are filled during the oxidation process. This results in a statistically more uniform breakdown voltage and a low leakage current of the capacitors.

In accordance with the invention, an improved electronic device is formed by depositing a thin film of high dielectric constant material on a substrate, exposing the structure to a remotely generated plasma to form a barrier layer; saturating the barrier layer by remote plasma oxidation (RPO) and then forming the top electrode. The plasma substantially reduces the density of charge traps at the dielectric/substrate interface because oxygen vacancies are saturated by the RPO step. Advantageously, the barrier layer prevents interdiffusion of metallic material and oxygen between the electrode and the dielectric thereby improving capacitor performance.

In another example, a high k dielectric is made from a top portion of a metal nitride layer by remotely generating a plasma using an oxygen containing source, and flowing the plasma over the upper surface of the metal nitride layer and diffusing oxygen into the layer to form a metal oxynitride on the upper surface. The bottom electrode may be made by physical vapor deposition of tantalum nitride.

A high capacitance density, MIM capacitor can thus be made, comprising a bottom electrode of tantalum nitride deposited by physical vapor deposition; an insulation layer formed by remote plasma oxidation of the upper surface of the tantalum nitride layer; and a top electrode formed over the insulative layer of TaON.

The top electrode may comprise titanium nitride or tantalum nitride, and may be deposited by chemical vapor deposition or physical vapor deposition processes.

The amount of nitrogen relative to metal may be varied, such that the upper portion of the bottom electrode has a different nitrogen to metal ratio (generally higher) than the nitrogen to metal ratio of the portion of the bottom electrode underlying the upper portion.

BRIEF DESCRIPTIONS OF THE DRAWINGS

The advantages, nature and various additional features of the invention will appear more fully upon consideration of the illustrative embodiments now to be described in detail. In the accompanying drawings.

Figure 7:
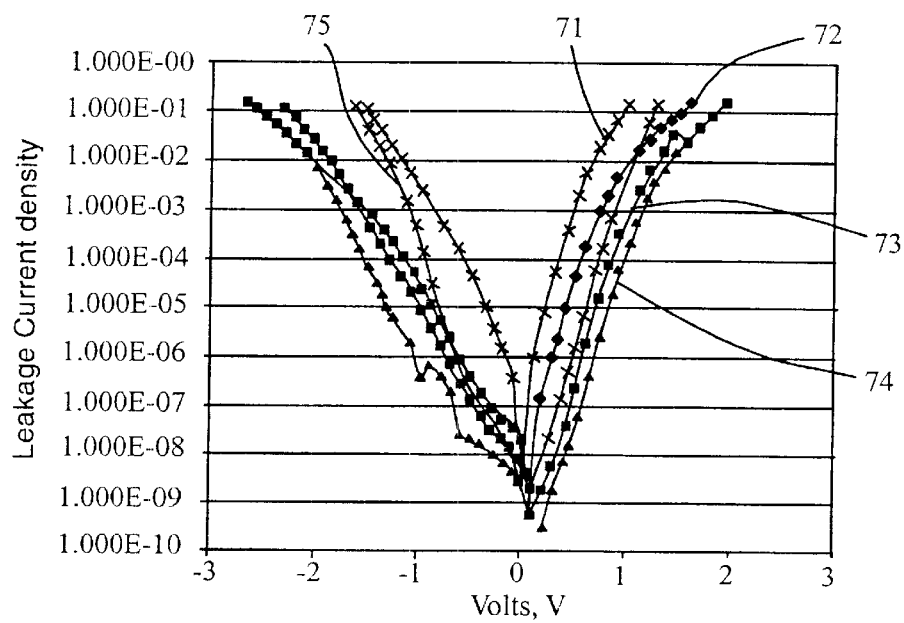

FIG. 7 graphs the leakage characteristics of TaON and TaNx dielectrics produced according to the invention.

Figure 8:
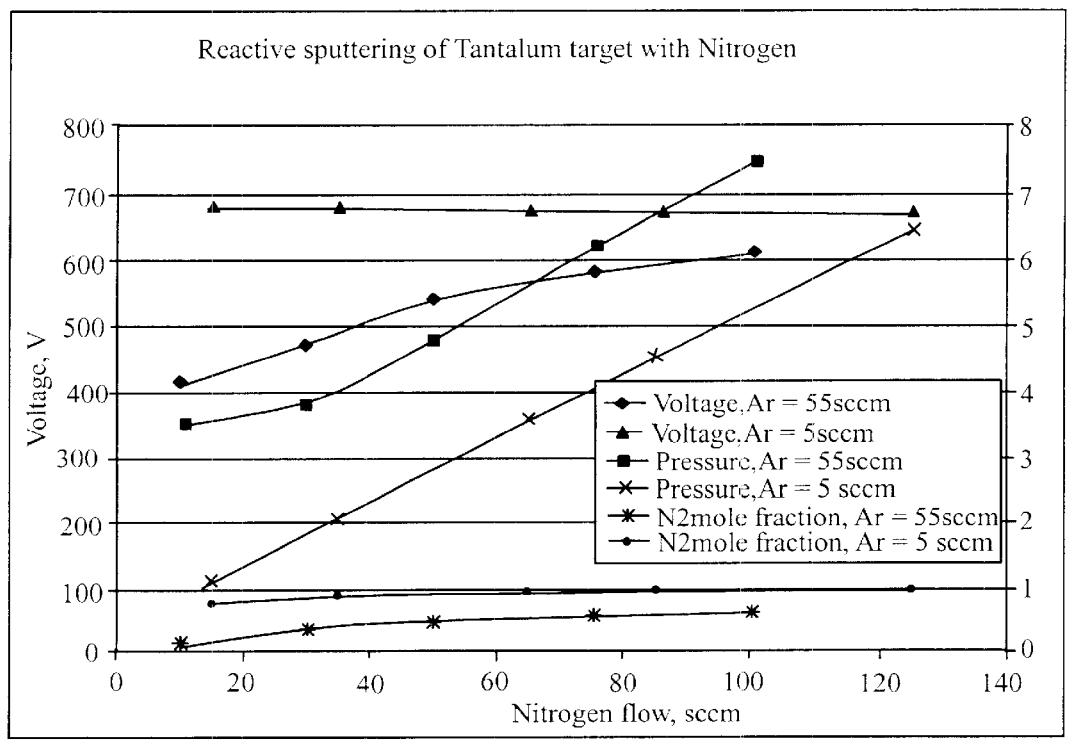

FIG. 8 plots the target voltage of tantalum nitride bottom electrodes prepared according to the present invention as a function of nitrogen flow.

Figure 9:
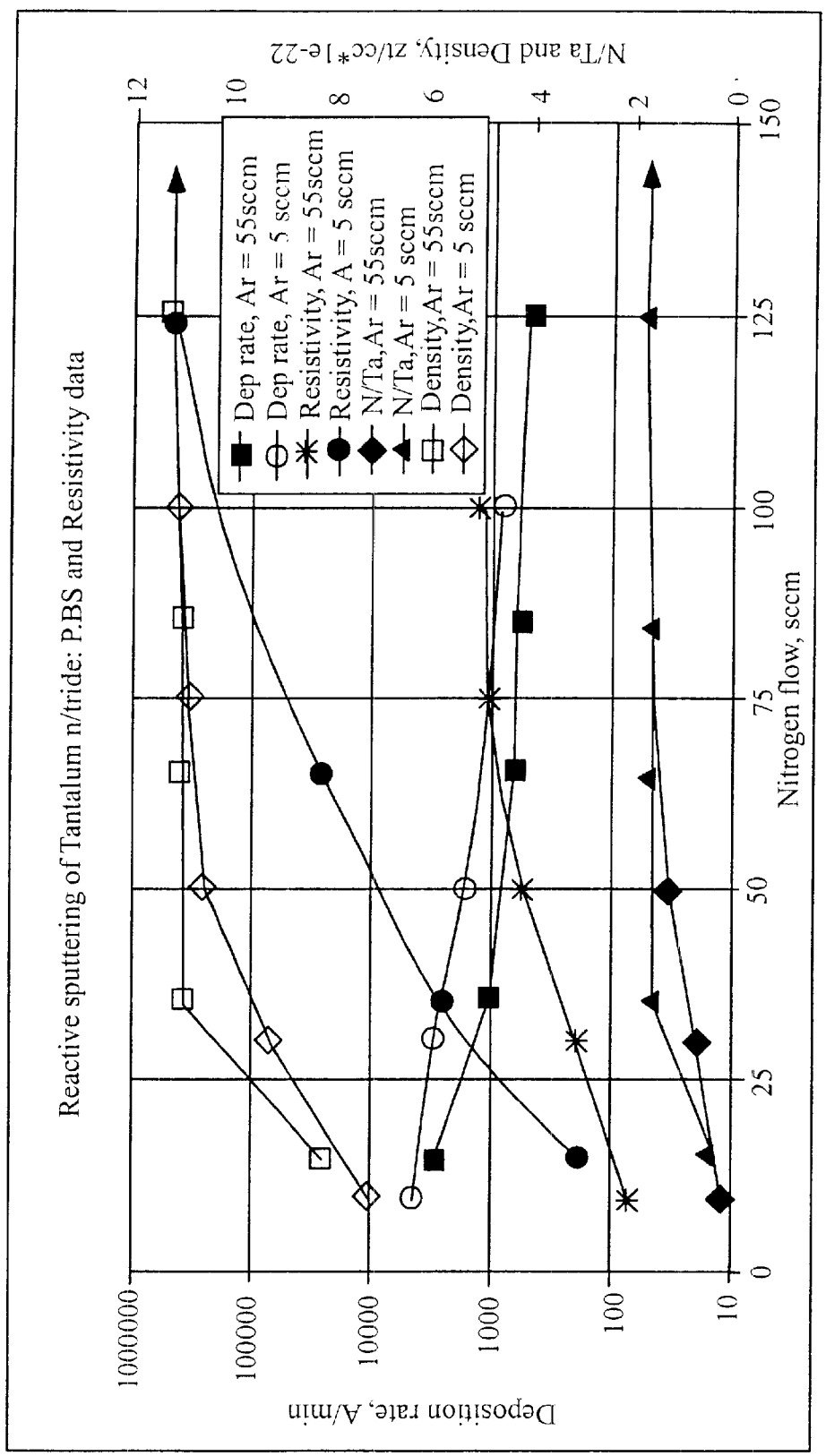

FIG. 9 plots the results from sheet resistance (Rs) and Rutherford back scattering (RBS) measurements performed on tantalum nitride bottom electrodes deposited as described herein.

It is to be understood that these drawings are for purposes of illustrating the concepts of the invention and are not to scale.

DETAILED DESCRIPTION OF THE INVENTION

Before the present techniques and films are described, it is to be understood that this invention is not limited to particular methods of deposition or films described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, the preferred methods and materials are now described.

It must be noted that as used herein and in the appended claims, the singular forms "a", "and", and "the" include plural referents unless the context clearly dictates otherwise. Thus, for example, reference to "a film" includes a plurality of such films and reference to "the heater element" includes reference to one or more heater elements and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

The term "substrate" broadly covers any object that is being processed in a process chamber. The term "substrate" includes, for example, semiconductor wafers, flat panel displays, glass plates or disks, and plastic work pieces.

The following abbreviations are used throughout the specification:

PVD is used for physical vapor deposition.

CVD is used for chemical vapor deposition.

PECVD is used for plasma enhanced chemical vapor deposition.

PECVD is used for plasma enhanced chemical vapor deposition.

RPECVD is used for remote plasma enhanced chemical vapor deposition.

RTPCVD is used for rapid thermal processing chemical vapor deposition.

TEOS is an acronym designating tetraethoxysilane.

RPN is used for remote plasma nitridation.

RPO is used for remote plasma oxidation.

MIM is used for a metal-insulator-metal construction, typically associated with a particular type of capacitor construction.

The invention involves the fabrication of an integrated circuit device with processing steps taken to improve the interface between a conductive material which is deposited over a dielectric material, to reduce or prevent migration between the materials and oxygen scavenging of the dielectric material by the conductive material. In particular, barrier treatments are provided for application to a $Ta_2O_5$ dielectric layer, on surfaces which are to interface with a conducting film deposited thereover, although the techniques described herein are also applicable to other dielectric materials, such as PZT, BST and the like, which would tend to react with metallic and other conductive layers deposited thereon.

Figure 1:
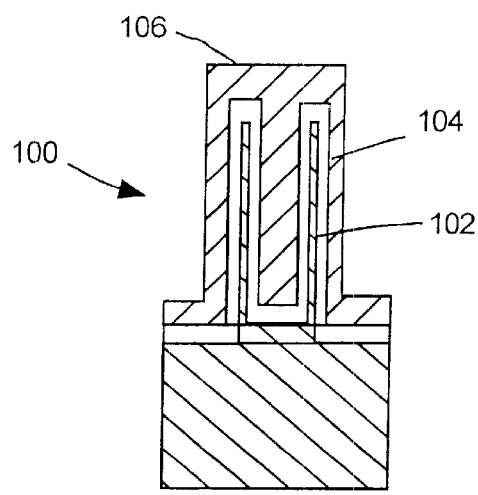
FIG. 1 is a schematic sectional representation of a known front end DRAM/e-DRAM capacitor stack structure.
Figure 2:
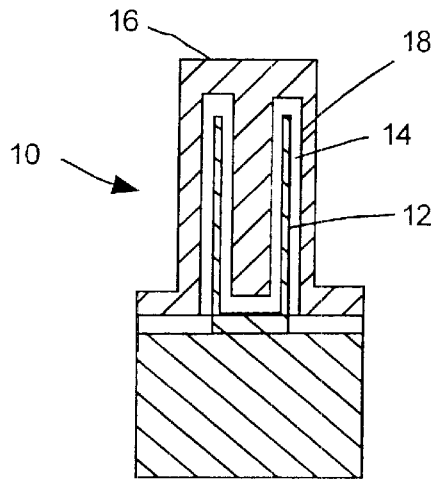
FIG. 2 is a schematic sectional representation of a front end DRAM/e-DRAM capacitor stack structure produced according to the present invention.

Turning now to FIG. 2, a schematic sectional representation of a front end DRAM/e-DRAM capacitor stack structure, similar to that shown in FIG. 1 is shown, although this example has been produced according to the present invention. The bottom electrode 12 need not be ruthenium, but could be any of a variety of materials used in the formation of a bottom electrode for a capacitor stack, such as tungsten, tanatalum, nitrides of the same, polysilicons, and other known materials. Thus, the application of the present invention is substantially independent of the type of bottom electrode used in such a stack.

In the example shown, the dielectric film 14 is $Ta_2O_5$, although the present invention is not limited to treatment of only this material, as noted above. Also as noted, $Ta_2O_5$ is currently a high-k material of interest whose large dielectric constant is the result of the strong ionic polarization. To obtain the high k necessary, the film must be free of impurities and have correct stoichiometry. The film becomes crystalline above temperatures of about 750° C. However, the present invention is useful for both crystalline and amorphous forms of $Ta_2O_5$ dielectric. However, these films are deposited using metal-organic chemical vapor deposition (MOCVD) processes at low temperature (300° C.–500° C.) to meet stringent step coverage requirements. The films are then annealed to achieve the desired capacitance and leakage current. A temperature of approximately ~600° C. is useful because it allows $CH_4$ and $H_2O$ gases to diffuse out of $Ta_2O_5$ films. Removal of such impurities reduces the leakage currents and increases their capacitance by increasing the film densities.

The $Ta_2O_5$ dielectric film 14 may be deposited, for example by thermal CVD using a deposition gas mix comprising a source of tantalum, such as, but not limited to, TAETO [$Ta(OC_2H_5)_5$] and TAT-DMAE [$Ta(OC_2H_5)_4(OCHCH_2N(CH_3)_2)$], and a source of oxygen such as $O_2$ or $N_2O$ can be fed into a deposition chamber while the substrate is heated to a deposition temperature of between 300–500° C. and the chamber maintained at a deposition pressure of between 0.5–10 Torr. The flow of deposition gas over the heated substrate results in thermal decomposition of the metal organic Ta-containing precursor and subsequent deposition of a tantalum pentoxide film. In one embodiment TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, $H_2$ and He, at a rate of between 0.5–2.0 SLM can be used to transport the vaporized TAETO or TAT-DMAE liquid into the deposition chamber. Deposition is continued until a dielectric film 14 of a desired thickness is formed. The desired thickness will vary depending upon the application that the capacitor is to be used for. For example, linear applications, such as for use in A/D conversion, generally uses a thickness of about 400–1000 Å, decoupling capacitors generally have a desired dielectric thickness of about 150–300 Å, and embedded DRAM applications generally have a desired thickness of about 80–150 Å. Tantalum pentoxide (or tantalum oxide, as it is sometimes called) is a useful material in the production of memory capacitors because, with a k value of about 25, it provides a potential 4-to-6 fold increase in capacitance over silicon oxide, depending on the barrier material scheme that is used.

After deposition of the film 14, the film 14 is typically annealed to complete the oxygenation of the oxide layer. The film 14 can be annealed by any well known and suitable annealing process such a rapid thermal anneal or a furnace anneal in an ambient comprising an oxygen containing gas, such as $O_2$ or $N_2$ at a temperature between 800–850° C., for example, for front end of the line processing. Back end of the line processing involves devices that have a lower thermal budget, and therefor the anneal is generally conducted at temperatures less than about 450° C.

Alternatively, the film 14 can be annealed with highly reactive oxygen atoms generated by disassociating an oxygen containing gas, such as $O_2$, with microwaves in a chamber which is remote or separate from the chamber in which the substrate is placed during the anneal. An anneal with reactive oxygen atoms which have been remotely generated is ideally suited for annealing a transition metal oxide dielectric film such as a tantalum pentoxide dielectric ($Ta_2O_5$). The annealing step balances the stoichiometry of the dielectric film 14 for optimal electrical properties because $Ta_2O_5$ deposits produce electrodes that are oxygen deficient and resistive (non-insulating). By annealing in oxygen, the correct stoichiometry is obtained.

Annealing of high-k films must be carefully controlled. The total thermal budget of a semiconductor device is limited. Exposure of the device to high-temperature anneals for extended periods can ruin the device. The annealing process can affect the substrate beneath the dielectric. For example, in $Ta_2O_5$ metal-insulator-silicon (MIS) structures for DRAM applications, the bottom electrode consists of ~20 Å SiN on polycrystalline silicon. During annealing, oxygen diffuses through the $Ta_2O_5$ and reacts to form low-k $SiO_2$ at the interface. As anneal process time increases, the capacitor stack storage capacity decreases. For e-DRAM applications, a typical treatment does not exceed about 30 minutes at a temperature of about 700° C., although these parameters can vary with varying designs of devices to be treated and the thermal budgets which correspond to them.

Figure 4:
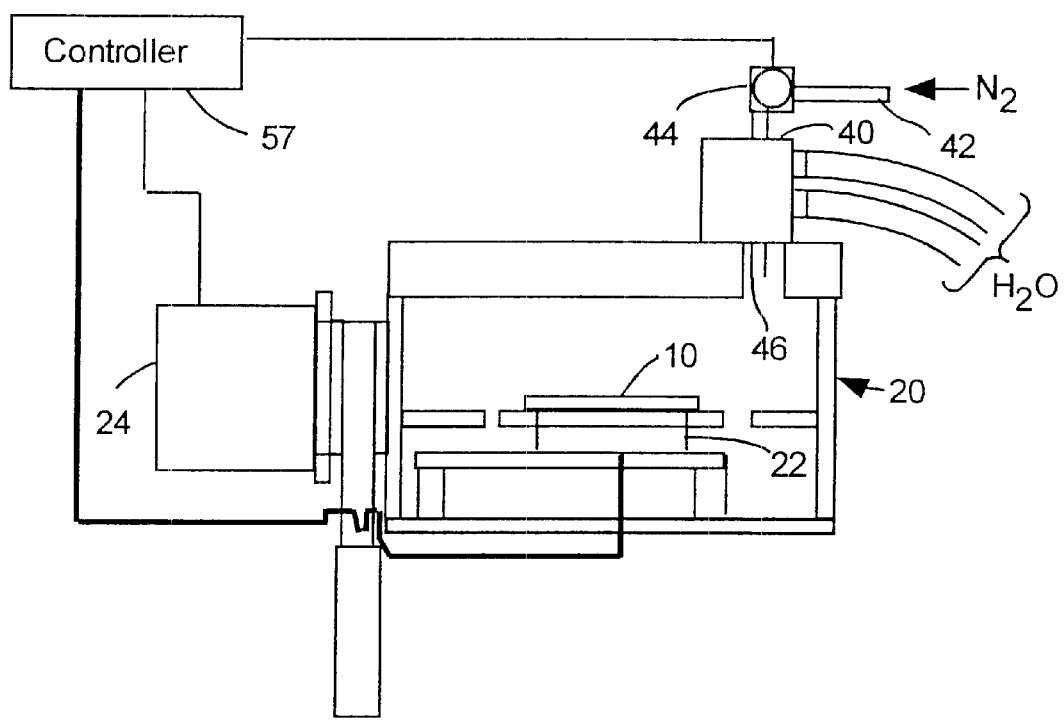
FIG. 4 shows a chamber which may be used in carrying out the present invention.

Prior to deposition of the top electrode 16, the dielectric layer 14 is next treated to form a boundary or barrier 18 on the surface of the dielectric layer 14 which will interface with the top electrode film 16. In one example treatment, a remote plasma nitridation (RPN) process is employed using $N_2$ to form an extremely thin (about 5 Å) layer of TaON at the surface of the dielectric layer 14. In this process, the substrate, including the bottom electrode 12 and dielectric layer 14 are positioned in a process chamber for application of the barrier 18. FIG. 4 shows a chamber 20, which may be an anneal chamber, such as the Applied Materials XZ Anneal Chamber, for example, which may be used in carrying out the present invention. It is noted that the present invention is not limited by the chamber described with regard to FIG. 4, but may be carried out in other chambers, including other CVD systems used with the Endura system manufactured and sold by Applied Materials, Inc. of Santa Clara, Calif., RTP chambers used with the Centura mainframe of Applied Materials, and other chambers including those used in PVD, CVD, PECVD, RPECVD and RTPCVD processes.

Chamber 20 is a vacuum tight chamber, and may be made of aluminum, for example. A susceptor 22 is situated in the chamber 20. Susceptor 22 may also be made of aluminum or ceramic, and functions to support the substrate including the dielectric layer 14 during processing. The susceptor includes built in resistive heating, as is known in the art.

A vacuum pump system 24 is connected to the chamber 20 and produces and maintains the required vacuum conditions in the chamber for processing. A remote chamber 40, which may be water-cooled, is mounted to chamber 20, on top of chamber 20 in this example, although a side mount may also be possible. Chamber 40 is used to remotely excite or activate a corresponding process gas, e.g., by forming a plasma, prior to flowing the excited process gas into chamber 20 and over the dielectric layer 14 to react therewith. In the above mentioned example, chamber 40 receives a nitrogen containing gas, such as $N_2$ or $NH_3$ through a supply line 42 that is controlled by a pulse valve 44, or other valve mechanism suitable for this purpose. The pulse valve 44 may be a solenoid or piezoelectric valve. Additionally, an inert carrier gas, such as argon or helium may be inputted, which acts to prevent activated nitrogen from recombining. Chamber 40 supplies activated nitrogen species into chamber 20 through injection port 46, mounted through the lid of the chamber 20. Chamber 40 is used to generate a remote plasma with the inputted gas or gases, to activate the species before it is flowed into the chamber 20.

In the described embodiment, the chamber 40 is a microwave generated plasma chamber, such as one produced by ASTEX, of Wilmington, Mass., for example. Alternatively, any one of a number of other appropriate known devices for exciting gases remotely can be used. For example, inductively coupled plasma generation (e.g., RF plasma) may be used, wherein a chamber is wrapped with a coil through which current is passed. The gas to be excited is also inputted to the chamber as the current is being passed through the coil, which inductively generates a plasma by electromagnetically exciting the gas. Similarly, magnetically coupled plasma generation may be performed wherein electromagnets are used to electromagnetically couple to the gas to form a plasma.

A programmed controller 57 controls and coordinates the operation of chamber 40, vacuum pump 24, pulse valve 44 and heating of the susceptor 22 to achieve the operation which will now be described. A memory (not shown) within the controller 57 stores computer-readable instructions which cause the controller 57 to operate the system as described in the next section.

A substrate 10 having the dielectric layer 14 deposited thereon is fed into chamber 20 by a robot blade (not shown) through a slit valve (not shown) in the wall of chamber 20 under transfer pressure. Lift pins (not shown) may pass through lift pin holes (not shown) in the susceptor 22 to facilitate the transfer of substrates into and out of the chamber 20, as known in the art.

Once the substrate 10 is positioned on the susceptor 22 and the susceptor 22 is in the processing position, chamber 20 is then pumped down to about 1–2 Torr and the chamber 20 and substrate 10 are brought within a temperature range of about 300–425° C. to ready the chamber for processing.

Next, a source gas containing nitrogen (e.g., $N_2$ or $NH_3$) is flowed into the chamber 40 through pulse valve 44 and converted to active nitrogen species by generating a plasma as described above, with microwave power being in the range of about 1400–4500 Watts. The activated nitrogen species are then flowed into chamber 20 through port 46 and allowed to pass over the surface of the dielectric layer 14, where it reacts with the $Ta_2O_5$ to form an extremely thin layer 18 of TaON (e.g., about 5 Å). The activated nitrogen species are flowed into chamber 10 at a flow rate of about 0.5–2 slm. An argon or helium carrier gas may also be flowed with the activated species, at a rate of about 1–2 slm, to prevent recombination of the activated nitrogen species. The flow rates are such to maintain a pressure of about 1–2 Torr in the chamber 10 during processing, at a temperature of about 300–425° C. These parameters can be adjusted, however, on the basis of empirical results, if required, to yield optimum results. It should be further noted, that the process temperature range is dependent upon the thermal budget of the device which is being treated. For example, for an e-DRAM, front end of the line application, a temperature range of about 600–700° C. may be employed. In contrast, for back end of the line capacitor devices, a temperature of about 300–350° C. my be used at a pressure less than or equal to about 2 Torr. Typically, this processing is conducted for about 2 to 3 minutes, but this may also vary, and can be adjusted on the basis of empirical results to yield optimum results. The activated nitrogen may be used to nitridate other dielectric layers which require a barrier at an interface with a conducting layer, as noted above.

By moving the source of activated nitrogen to a remote plasma chamber, the chemistry can be controlled over a much broader range of operating and process conditions. For example, the temperature of the process can be run at about 300° C. to about 700° C., thereby helping to keep within the thermal budget. Typically maximum temperatures allowed for such processing should be kept below 750° C. so as not to damage the underlying logic gates. For MIM applications, the temperatures may be kept less than about 400° C. In addition, keeping the activation step separate from the deposition step insures that a very thin surface layer can be grown as the nitridated layer. That is, the nitrogen is not allowed to react within the dielectric layer, but only on the surface. That is, by separating the nitrogen plasma, the generation of activated nitrogen species above the substrate is prevented during the deposition of the dielectric layer. A wider range of process conditions are also available for conducting the deposition phase of the dielectric layer, due to the remote plasma generation.

Following the formation of the barrier 18, the top electrode 16 is next deposited, for example by a thermal CVD process. In this example, the top electrode is a film of TiN deposited by thermal CVD, although other materials, such as TaN or other metal, for example may be used for the top electrode. Any well known technology can be used to form the top electrode 16 including blanket depositing the conducting film over the barrier 18 and then using well known photolithography and etching techniques to pattern the electrode film and dielectric layer.

When depositing a TiN film using thermal CVD, $NH_3$ and $TiCl_4$ are typically used as components of the deposition gas, in which case $NH_3$ and chlorine can react with $Ta_2O_5$ to reduce it, thereby scavenging oxygen from the dielectric layer. The TaON barrier 18 prevents this from occurring.

In another example of a process for forming a barrier 18, a thicker layer of TaON is formed on the surface of a $Ta_2O_5$ dielectric layer 14. Once the substrate is positioned on the susceptor and the susceptor 22 is in the processing position, the chamber 20 is then pumped down to processing pressure and brought to a processing temperature, as described above. In this example, $NH_3$ is supplied to the remote plasma chamber 40 and a plasma is generated for an RPN process, using the same power range to generate the plasma as above.

The activated species (e.g., $NH_3$,) is flowed into the chamber 20 through pulse valve 44 and port 46 and allowed to pass over the surface of the dielectric layer 14, where it reacts with the $Ta_2O_5$ to form a thicker layer 18 of TaON (e.g., about 10–30 Å) which has more oxygen vacancies than the TaON layer formed by activated $N_2$. The source of nitrogen and the source of hydrogen need not be provided by $NH_3$, but may be inputted to the chamber 40 separately in the form of $N_2$ and $H_2$, for example. Typically, this process is run for less than or equal to 2 minutes, although the time can be adjusted on the basis of empirical results to yield optimum results.

Following formation of the TaON layer by RPN, a mild oxidation process is performed by RPO to fully saturate any reduced TaO radicals that may exist in the layer. RPO is conducted by supplying $O_2$ or $N_2O$ to the remote plasma chamber 40 and a plasma is generated for an RPO process. For example $O_2$ gas may be supplied at about 2 slm to give an $N_2:O_2$ ratio of 1:2, at a pressure of about 1–2 Torr. For front end of the line applications, the processing temperature is about 500–600° C., while for back end of the line applications, the processing temperature is about 300–400° C., although these parameters can be adjusted on the basis of empirical results to yield optimum results. The foregoing process can also be used to nitridate other dielectric layers which require a barrier at an interface with a conducting layer, as noted above.

In still another example of forming a barrier 18, the barrier 18 comprises TiON. In this example, a $Ta_2O_5$ dielectric film 14 is deposited on a substrate and annealed as described above in the previous examples. The substrate (including the dielectric film 14) is next treated in a CVD chamber to deposit a layer of TiN by CVD over the dielectric film, by currently best known methods of depositing the TiN. The deposition of TiN is continued until a layer 18 having a thickness of about 10 to 30 Å has been deposited.

Next, the layer 18 is subjected to a mild oxidation by RPO to form a thin layer (e.g., about 5 Å) of TiON at the surface of the TiN layer 18, using the generally the same parameters as described above with regard to RPO processing of the TaON layer, wherein front end of the line processing is conducted temperatures less than or equal to about 600° C. and back end of the line processing is conducted at about 350–400° C.

Following the RPO step, the top electrode 16 is next deposited, for example by a thermal CVD process. In this example, the top electrode is a film of TiN deposited by thermal CVD, although other materials, such as TaN or other conductive metals or nitridated metals, for example may be used for the top electrode. Any well known technology can be used to form the top electrode 16 including blanket depositing the conducting film over the barrier 18 and then using well known photolithography and etching techniques to pattern the electrode film and dielectric layer.

An advantage of all of the above-described processes is that a capacitor with a low thermal budget (<700 C.) can be produced with a high dielectric constant.

Figure 3:
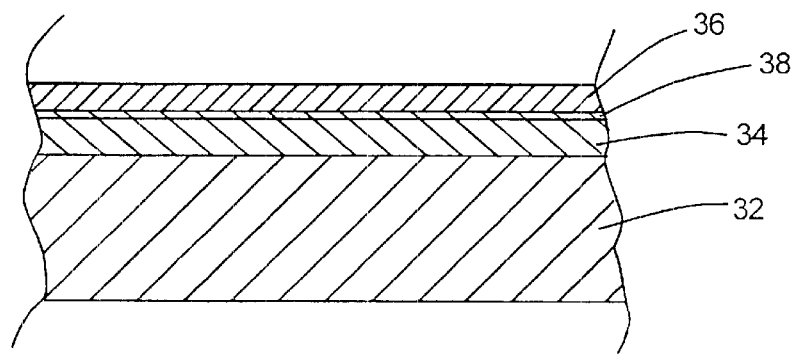
FIG. 3 is a schematic sectional representation of a semiconductor stack including a conducting layer overlaying a dielectric layer on a substrate according to the present invention.

As noted above, the present invention is applicable to a number of different semiconductor devices where formation of embedded doped regions and/or the integrated formation of gate insulating layer and spacer structures are desirable. The invention is generally applicable to any semiconductor application where a barrier is needed between a high k dielectric layer over which a conducting layer is to be deposited, to prevent intermigration of the dielectric and conducting species and to prevent oxygen scavenging of the dielectric layer. At the same time, the procedures described herein are useful for a device which requires a low thermal budget. FIG. 3 is a partial sectional schematic of a stack employing a barrier 38 according to the present invention. A high k dielectric layer 34 has been deposited on a substrate 32 according to known techniques. The substrate 32 may include, for example, a silicon wafer with insulation layer and logic gates formed thereon, and a conducting layer, for example. The high k dielectric layer may comprise $Ta_2O_5$, PZT, BST or any of a number of known high k dielectric materials. The barrier 38 may be formed by any of the above-described processes with regard to barrier 18, and functions to prevent reaction/migration between the conducting layer 36 and the dielectric layer 34. The conducting layer 36 may be TiN or TaN, for example, or other known conducting metallic or polysilicon layers, and may be deposited by known CVD processes or other known processes suitable for the application.

Figure 5:
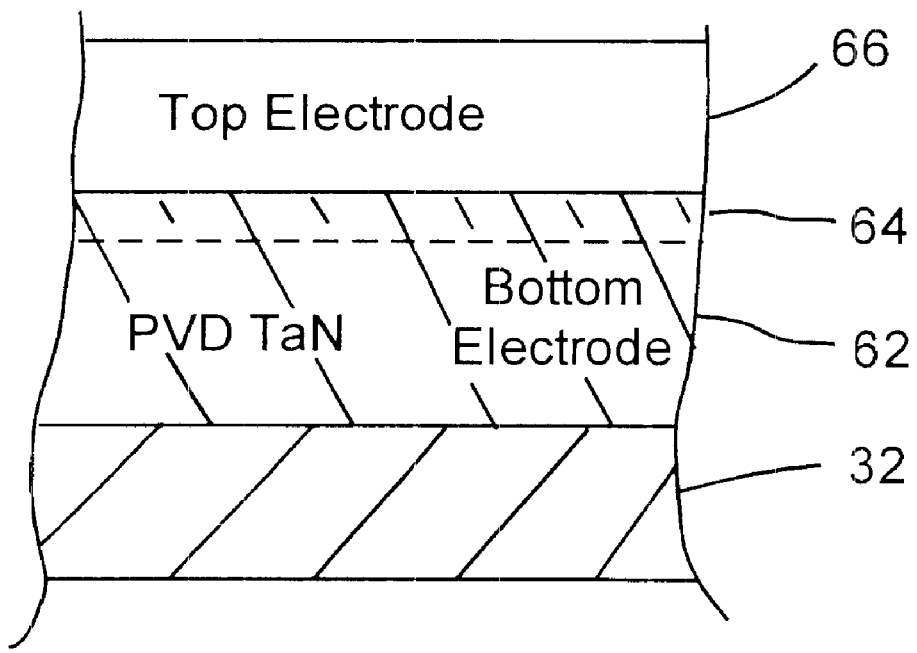
FIG. 5 is a schematic sectional representation of a semiconductor stack of a type useful in making back end MIM capacitors.

FIG. 5 is a schematic sectional representation of a semiconductor stack of a type useful in making back end MIM capacitors. In this embodiment, a metal nitride bottom electrode layer 62 is first deposited. Next, the dielectric 64 of the construct is formed by remote plasma oxidation of the bottom electrode 62. The remote oxidation treatment may be conducted using any of the chambers previously discussed. Oxygen, in the form of $O_2$, $N_2O$, or other gas or gas mixture having a large amount of available oxygen is fed into a remote plasma chamber (such as remote plasma chamber 40, for example) and a plasma is generated for an RPO process. For example, $O_2$ gas may be supplied at about 1–2 slm at a pressure of less than or equal to about 2 Torr. The annealing time for this RPO process is generally greater than 0 to about 5 minutes, more typically ranging from about 1 to 3 minutes, depending on the temperature used, although this time may be adjusted to vary the depth of oxygen penetration into the bottom electrode. For example, a higher temperature will generally require a shorter annealing time. Since this construction is designed particularly for back end of the line processes, the processing temperature will generally run at around 300–400° C. As in the previous examples, the processing parameters for this embodiment may also be varied on the basis of empirical results to yield optimum results.

In a preferred example, the bottom electrode 62 is formed of tantalum nitride and is deposited by physical vapor deposition. The physical vapor deposition may be performed in a Ch4 PVD System 3020 (Applied Materials, Santa Clara, Calif.), for example, or any other PVD chamber known in the art for such purposes. Tantalum films were sputtered in a PVD chamber (Ch 4, system 3020) with different Nitrogen flows and fixed argon flow. Table 1 shows the matrix that was run. Two different Argon flows were used and the sputtering times were held the same for each flow. The argon flow through the heater was maintained at 15 sccm and the sputtering power was held at 7 kW for all the runs. The heater temperature was maintained at 300° C.

TABLE 1

Process conditions for sputter deposition of tantalum nitride films

| N2 content | Dep time | Dep power | Ar/ArH |
| --- | --- | --- | --- |
| 10 | 30s | 7 kW | 55/15 |
| 30 | 30 s | 7 kW | 55/15 |
| 50 | 30 s | 7 kW | 55/15 |
| 75 | 30 s | 7 kW | 55/15 |
| 100 | 30 s | 7 kW | 55/15 |
| 10 | 60 s | 7 kW | 55/15 |
| 10 | 60 s | 7 kW | 55/15 |
| 15 | 32 s | 7 kW | 5/15 |
| 35 | 32 s | 7 kW | 5/15 |
| 65 | 32 s | 7 kW | 5/15 |
| 85 | 32 s | 7 kW | 5/15 |
| 125 | 32 s | 7 kW | 5/15 |

The process data from Table 1 is summarized in FIG. 8. It is evident from FIG. 8, that as nitrogen flow (mole fraction) increases the target voltage follows, indicating increasing "poisoning" or nitridation of the target. Also the increasing chamber pressure indicates increased poisoning of the target. At lower argon flows the voltages are consistently high, owing to the low plasma density. Also the nitrogen mole fraction is consistently high. At the higher argon flow the voltage is seen to increase steadily with the nitrogen flow.

However since the target power is high, the target is not completely poisoned and hence there is no sudden change in pressure or voltage with flow. In other words a hysteresis loop, characteristic of reactive sputtering processes is not seen.

The results from the sheet resistance (Rs) and Rutherford back scattering (RBS) measurements are summarized in FIG. 9. The nitrogen to tantalum ratio is seen to increase steadily for the case with the higher argon flow. In the other case, the ratio increases abruptly and then increases very gradually. The deposition rates decrease rapidly initially and then at a much slower rate. The resistivity of the film increases rapidly and monotonically for films sputtered with lower argon flow, while in the other case, the increase is steady for flows up to 50 sccm and very small after that.

It is thus possible to sputter Tantalum nitride ($Tan_x$) films with a wide range of stoichiometric compositions. as an electrode cum barrier material for fabrication of thin film capacitors on copper. Properties such as resistivity and density of these films, together with the deposition rate have also been studied.

X-ray diffraction was done on these films, mainly to identify the phases present in the film. The results are summarized in Table 2. At the lower argon flow, nitrogen deficient tantalum nitride with a cubic symmetry is formed first. Then a mixture of phases with different crystal structure form. It is seen that as nitrogen content increases further there is no change in the phases or the crystal structure. In conjunction with the RBS data, this implies preferential formation of one phase over the other.

At lower argon flows however nitrogen rich films amorphous films are formed, except at very low nitrogen flow. This can be explained by looking at the mole fraction of nitrogen. From FIG. 8, it is clear that this is always high for low argon flow. This is also supported by the resistivity data from FIG. 9.

TABLE 2

XRD data summary for Tantalum nitride films

| N2 flow, sccm | Dep time | Dep power | Ar/ArH | | |
| --- | --- | --- | --- | --- | --- |
| 10 | 30 s | 7 kW | 55/15 | TaNx, x >= 0.1 | Cubic (W) |
| 30 | 30 s | 7 kW | 55/15 | TaNx, x >= 0.1, TaNx, x~1 | Cubic (W) and Cubic (NaCl) |
| 50 | 30 s | 7 kW | 55/15 | TaNx, x >= 0.1, TaNx, x~1 | Cubic (W) and Hexagonal |
| 75 | 30 s | 7 kW | 55/15 | TaNx, x >= 0.1, TaNx, x~1 | Cubic (W) and Hexagonal |
| 100 | 30 s | 7 kW | 55/15 | TaNx, x >= 0.1, TaNx, x~1 | Cubic (W) and Hexagonal |
| 15 | 32 s | 7 kW | 5/15 | TaNx, x <= 0.5 | Hexagonal (Fe2N) |
| 35 | 32 s | 7 kW | 5/15 | TaNx, x >= 1.7 | Amorphous |
| 65 | 32 s | 7 kW | 5/15 | TaNx, x >= 1.7 | Amorphous |
| 85 | 32 s | 7 kW | 5/15 | TaNx, x >= 1.7 | Amorphous |
| 125 | 32 s | 7 kW | 5/15 | TaNx, x >= 1.7 | Amorphous |

After formation of the bottom electrode, remote plasma oxidation of TaN bottom electrode 62 is then carried out as described above, generally for a period of about 0 to 5 minutes, more typically from about 1 to 3 minutes, depending upon the temperature of the annealing process, or until TaON 64 is established to a depth down to about 50 Å or less beneath the top surface of the electrode 62. During the RPO, the oxygen plasma flows over the top surface of the electrode 62 at which time it diffuses into the TaN material, reacting with it to form TaON, which acts as a high k dielectric material. The concentration of oxygen in the TaON layer varies according to a gradient, with the highest concentration being at the top surface of the electrode 62 and decreasing with greater depth below the top surface.

After formation of the TaON insulator, a top electrode 66 is deposited there over, in much the same manner described above with regard to depositions of top electrodes. The top electrode may be formed of TiN deposited by thermal CVD or PVD, although other materials, such as TaN or other conductive metals or nitridated metals, for example may be used for the top electrode. Any well known technology can be used to form the top electrode.

MIM capacitors of this construction exhibit a relatively high capacitance density (e.g., from about 20 to about 35 $fF/\mu^2$), particularly those stacks for which the depth of TaON does not exceed about 30 Å. For example, capacitance densities of greater than 35 $fF/\mu m^2$ have been achieved. However, the leakage current in these constructions is also relatively high, due to the characteristics of the dielectric layer 64 formed in this manner. Such a construction is useful, however, in applications where leakage current is less critical than in most application. For example, these constructions are useful for MIM capacitors to be used as decoupling capacitors for high frequency microprocessors.

Figure 6:
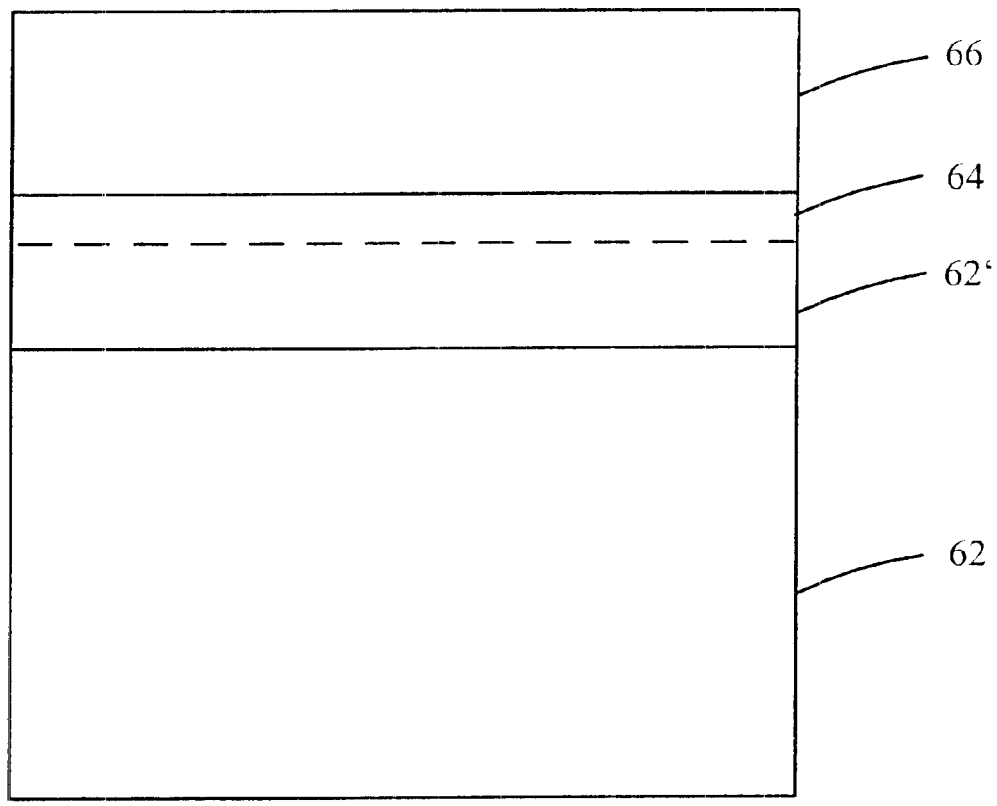
FIG. 6 is a schematic sectional representation of another example of a semiconductor stack of a type useful in making back end MIM capacitors.

FIG. 6 is a schematic sectional representation of another example of a semiconductor stack of a type useful in making back end MIM capacitors. In this embodiment, a metal nitride bottom electrode layer 62, in this case TaN, is first deposited by PVD as described above, to establish a thickness of about 1000 Å A ratio of N/Ta atoms in this layer is about 0.26. A further deposition of TaN by PVD is continued while varying the N/Ta ratio to establish an additional thickness 62' of about 300 Å of the layer 62, where the additional thickness 62' (i.e., top portion of layer 62) has an N/Ta ratio varying from that of the bottom portion of the layer 62, wherein the N/TA ratio is preferably greater than 0.26. For example, the N/Ta ratio of top portion 62' generally ranges from greater than 0.026 to about 1.6. Next, the dielectric 64 of the construct is formed by remote plasma oxidation of the bottom electrode 62, as described previously.

Remote plasma oxidation of TaN bottom electrode 62 is carried out as described above, generally for a period of about greater than zero to about five minutes, more typically about one to three minutes, or until TaON 64 is established to a depth down to about 50 Å or less beneath the top surface of the electrode 62 (i.e. top portion 62'). The concentration of oxygen in the TaON layer varies according to a gradient, with the highest concentration being at the top surface of the electrode 62 (i.e., 62') and decreasing with greater depth below the top surface.

After formation of the TaON insulator, a top electrode 66 is deposited there over, in much the same manner described above with regard to depositions of top electrodes. The top electrode may be formed of TiN deposited by thermal CVD or PVD, although other materials, such as TaN or other conductive metals or nitridated metals, for example may be used for the top electrode. The top electrode 66 may have a thickness of about 500 Å to about 1000 Å, for example, and in the example shown in FIG. 6, has a thickness of about 650 Å. Any well known technology can be used to form the top electrode, as noted above, although a shadow mask techniques was used in the example shown in FIG. 6.

FIG. 7 graphs the leakage characteristics of TaON dielectrics produced according to the invention as described with regard to FIGS. 5 and 6 above, as well as an example of an unannealed TaNx dielectric, where the Y-axis indicates leakage current density in Amps/cm$^2$, and the X-axis indicates voltage, in Volts. Plot 71 illustrates the characteristics of a construction for which the N/Ta ratio is 0.26, (i.e., where either no additional layer thickness 62' was deposited, or, if an additional thickness 62' was deposited, the N/Ta ratio was not varied from the underlying layer thickness 62) and where RPO was carried out for three minutes at 300° C. Plot 72 illustrates the characteristics of a construction for which the N/Ta ratio is 0.26, (i.e., where either no additional layer thickness 62' was deposited, or, if an additional thickness 62' was deposited, the N/Ta ratio was not varied from the underlying layer thickness 62) and where RPO was carried out for one minute at 400° C. Plot 73 illustrates the characteristics of a construction for which the N/Ta ratio of upper portion 62' is 1, and where RPO was carried out for one minute at 400° C. Plot 74 illustrates the characteristics of a construction for which the N/Ta ratio of upper portion 62' is 1.68, and where no anneal by RPO was carried out. Plot 75 illustrates the characteristics of a construction for which the N/Ta ratio of upper portion 62' is 1.68, and where RPO was carried out for one minute at 400° C.

The leakage values (at 1 V and −1 V) and capacitance densities for each of the plots 71–75 are tabulated in Table 3 below.

TABLE 3

| | | Leakage Values at +1V and −1V | | | |
|---|---|---|---|---|---|
| | | Anneal Conditions | | C/A | J(A/sq cm) |
| Plot No. | N/Ta | Temp (C.) | Time (min) | FF/sq micron | 1V | −1V |
| 71 | 0.26 | 300 | 3 | 31.3 | 1.56E−01 | 2.75E−03 |
| 72 | 0.26 | 400 | 1 | 22.6 | 9.31E−03 | 2.46E−05 |
| 73 | 1.0 | 400 | 1 | 20.5 | 1.10E−03 | 8.63E−06 |
| 74 | 1.6 | No anneal | | 21.7 | 2.15E−04 | 4.74E−07 |
| 75 | 1.6 | 400 | 1 | 34.4 | 9.00E−03 | 1.24E−04 |

Although the leakage performance of the TaON dielectric or the nitrogen rich TaNx dielectric is not as good as a $Ta_2O_5$ dielectric dielectric described herein, it does meet device specifications for decoupling capacitors for high frequency microprocessors. With a relative increase in nitrogen content (i.e., by increasing the N/Ta ratio in upper portion 62') the leakage performance improves. However, in the case of unannealed TaN having the higher nitrogen content (i.e., plot 74 in FIG. 7) capacitance density significantly decreases, relative to annealed products. By annealing the increase nitrogen containing portion 62' to form TaON (i.e., plot 75 in FIG. 7) as described herein, a greater than 50% increase in capacitance density is achieved without giving up a proportional amount of leakage performance.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of making a barrier on a high k dielectric material, comprising the steps of:

provided a substrate having an upper surface comprising a high k dielectric material;

remotely generating a plasma using a nitrogen containing source;

flowing the plasma over the upper surface comprising a high k dielectric material to form an oxynitride layer on the upper surface;

remotely generating an oxygen plasma using a source of oxygen;

flowing the oxygen plasma over the oxynitride layer on the upper surface of the substrate to saturate and reduce species remaining in the oxynitride layer; and annealing at least said upper surface of said substrate in an oxygen rich environment prior to said flowing the plasma.

2. The method of claim 1, wherein said high k dielectric material comprises $Ta_2O_5$.

3. The method of claim 2, wherein said nitrogen containing source comprises $N_2$ and said oxynitride layer comprises TaON.

4. The method of claim 3, wherein said flowing step is continued until said TaON layer is about 5 Å thick.

5. The method of claim 2, wherein said nitrogen containing source comprises $NH_3$ and said oxynitride layer comprises TaON.

6. The method of claim 5, wherein said TaON layer is formed to a thickness of about 10 to 30 Å.

7. The method of claim 1, further comprising the step of depositing a conducting layer over the oxynitride layer.

8. The method of claim 7, wherein said conducting layer is a top electrode.

9. The method of claim 7, wherein said conducting layer comprises TiN.

10. The method of claim 1, wherein the step of flowing the plasma over the upper surface comprising a high k dielectric material is conducted within a temperature range of about 300° to 700° C.

11. A method of making a barrier on a high k dielectric material, said method comprising the steps of:

providing a substrate having an upper surface comprising a high k dielectric material;

depositing a layer of TiN on said upper surface by chemical vapor deposition;

remotely generating a plasma using an oxygen containing source; and flowing the plasma over the TiN layer to form an oxynitride layer on the upper surface.

12. The method of claim 11, further comprising the step of annealing at least said upper surface of said substrate in an oxygen rich environment prior to said depositing a layer of TiN.

13. The method of claim 11, wherein said depositing a TiN layer by chemical vapor deposition is carried out until said TiN layer achieves a thickness of about 30 to 50 Å.

14. The method of claim 11, wherein said oxygen containing source is oxygen.

15. The method of claim 11, wherein said high k dielectric material comprises $Ta_2O_5$.

16. The method of claim 15, wherein said oxynitride layer comprises TaON.

17. The method of claim 11, further comprising the step of depositing a conducting layer over the oxynitride layer.

18. The method of claim 17, wherein said conducting layer is a top electrode.

19. The method of claim 17, wherein said conducting layer comprises TiN.

20. The method of claim 11, wherein the step of flowing the plasma over the TiN layer is conducted within a temperature range of about 300° to 700° C.

21. A method of making a high k dielectric from a top portion of a metallic layer, said method comprising the steps of:

providing a layer of metal nitride having a first metal to nitride atoms ratio;

depositing additional metal nitride while varying the metal to nitride atoms ratio during said depositing to form an additional thickness to said layer, wherein said additional thickness has a varying metal to nitride atoms ratio;

remotely generating a plasma using an oxygen containing source; and flowing the plasma over the upper surface of the additional thickness of the metal nitride layer and diffusing oxygen into the additional thickness of the layer to form a metal oxynitride on an upper surface thereof.

22. The method of claim 21, wherein said metal nitride comprises tantalum nitride.

23. The method of claim 22, further comprising the step of depositing said tantalum nitride layer by physical vapor deposition, prior to said step of remotely generating a plasma.

24. A method of making a high capacitance density, MIM capacitor, comprising the steps of:

depositing a bottom electrode of tantalum nitride by physical vapor deposition;

remotely generating a plasma using an oxygen containing source;

flowing the plasma over the upper surface of the tantalum nitride layer and diffusing oxygen into the layer to form a tantalum oxynitride on the upper surface;

depositing a top electrode over the tantalum oxynitride; and during said depositing of said bottom electrode, increasing the amount of nitrogen relative to tantalum, such that a ratio of N/Ta is greater in a top portion of said bottom electrode than a ratio of N/Ta in a portion of said bottom electrode underlying said top portion.

* * * * *